United States Patent
Wang et al.

(10) Patent No.: US 8,204,563 B2
(45) Date of Patent: Jun. 19, 2012

(54) SUPERCONDUCTING MAGNET SYSTEM FOR GENERATING HIGH HOMOGENEITY AND HIGH MAGNETIC FIELD

(75) Inventors: Qiuliang Wang, Beijing (CN); Xinning Hu, Beijing (CN)

(73) Assignee: Institute of Electrical Engineering, Chinese Academy of Sciences (JP)

( * ) Notice: Subject to any disclaimer, the term of this patent is extended or adjusted under 35 U.S.C. 154(b) by 35 days.

(21) Appl. No.: 12/994,562

(22) PCT Filed: Jan. 20, 2009

(86) PCT No.: PCT/CN2009/000083
§ 371 (c)(1),
(2), (4) Date: Nov. 24, 2010

(87) PCT Pub. No.: WO2010/066087
PCT Pub. Date: Jun. 17, 2010

(65) Prior Publication Data
US 2011/0082043 A1    Apr. 7, 2011

(30) Foreign Application Priority Data

Dec. 11, 2008  (CN) .......................... 2008 1 0239180

(51) Int. Cl.
*H01B 12/00* (2006.01)
*H01F 6/00* (2006.01)
*H01L 39/00* (2006.01)
*H01L 39/24* (2006.01)

(52) U.S. Cl. .......................... 505/211; 505/230; 335/216
(58) Field of Classification Search .................. 505/211, 505/230, 850, 879; 335/216; 174/125.1; 324/319
See application file for complete search history.

(56) References Cited

U.S. PATENT DOCUMENTS

| 7,015,779 | B2 * | 3/2006 | Markiewicz et al. ......... 335/299 |
| 7,876,100 | B2 * | 1/2011 | Huang et al. ................... 324/319 |
| 7,924,126 | B2 * | 4/2011 | Hait et al. ..................... 335/216 |
| 2004/0162222 | A1 | 8/2004 | Markiewicz et al. |
| 2006/0176132 | A1 * | 8/2006 | Atkins et al. .................. 335/216 |
| 2006/0197637 | A1 * | 9/2006 | Mallett ........................ 335/216 |

FOREIGN PATENT DOCUMENTS

| CN | 1828789 A | 9/2006 |
| CN | 1835318 A | 9/2006 |
| CN | 1959874 A | 5/2007 |
| JP | 2-260403 A | 10/1990 |
| JP | 2005-353777 A | 12/2005 |

* cited by examiner

*Primary Examiner* — Colleen Dunn

(57) ABSTRACT

A superconducting magnet system for generating high homogeneity and high magnetic field consists of a main coil, an outer coil, a quench protection circuit, a quench heater and a power supply. The main coil is composed of many concentric solenoid coils which are arranged from inside to outside. The outer coil out of the main coil includes a first back roll coil, a second back roll coil, a first superconducting coil for compensating sixth harmonic component, a second superconducting coil for compensating sixth harmonic component, a shielding ring and a shielding coil from inside to outside. Every loop circuit of the quench protection circuit is composed of a corresponding protection resistor, a diode and coil which is connected in series each other, and each coil has a corresponding quench protection heater. The classification linear diameter difference of the superconducting coils which contact each other in main coil is less than 0.05 mm. The homogeneity of the magnetic field in the 50 mm diameter working space is 0.15 ppm, because the high order harmonic component of the field is compensated by back roll method.

8 Claims, 3 Drawing Sheets

SUPERCONDUCTING MAGNET SYSTEM FOR GENERATING HIGH HOMOGENEITY AND HIGH MAGNETIC FIELD

TECHNICAL FIELD

The present invention relates to a high homogeneity and high magnetic field superconducting magnet system for scientific instruments and special physical experimental devices, in particular, a magnet system for 400 MHz superconducting nuclear magnetic resonance spectrometer.

BACKGROUND

Many special physical experimental and scientific instruments need a superconducting magnet system capable of generating high homogeneity and high magnetic field to study structures of matter, particularly to study macromolecule structures and components, such as proteins and genetic engineering. The researches about modern physical science also need relatively high magnetic field. In general, the magnetic induction strength of high magnetic field may be in the order of several Tesla or above. Different from those regular low magnetic fields applied on macro-objects, high magnetic fields can produce some ultra conditions and have significant effects on the tissue and performance of a material. Furthermore, a directional arrangement of material tissue resulting from a directional outer force field, such as high gravity field, stress field, electrical field and magnetic field etc. applied can effectively improve various material performances. High magnetic field has characteristics of huge energy, being contactless and stableness and thus is ideal directional field. High magnetic fields may control fluid flow, which is critical to system thermal and mass conductivity and crystal growth. Through controlling fluid flow by means of high magnetic field, it is possible to control the solute distribution, solidified tissue morphology, chemical reaction rate of a material, thus having great theoretic and practical values. It means that, high magnetic fields may be used to control the crystal growth morphology, size, distribution and tropism during the crystal solidification process of material, thus controlling the tissue of material, and finally obtaining a new material with perfect mechanical and physical performances. In the condition of a high magnetic field, it is possible to simulate the microgravity condition in outer-space environment to achieve controlled crystal diffusion growth and develop methods and techniques for preparing new semiconductor, metal and nonmetal materials. Through controlling the strength of an outer magnetic field, it is possible to implement researches under simulated multiple-gravity (overweight) condition, or simulate a comparable stress and strain environment subjected to by a material in a large-scale research object with a higher force field on a reduced-scale model, such as to simulate the stress caused by gravity field on a reduced-scale model with a high magnetic field, to study the durability and the disaster-resistant capability of a large-scale dam project. Further, through controlling the distribution of a high magnetic field to impose an inhomogeneous stress on a material, it is also possible to simulate the stress, strain caused by an outer inhomogeneous field, for example, to substitute or simulate mechanical stress with stress produced by magnetic field, in order to study aircraft structural fatigue phenomenon and the like. The study of these new physical phenomena needs a special configuration of high magnetic field environment with tens of thousands Gauss, high homogeneity and high stability, the superconducting magnet technique is considered as a reasonable and economical solution.

Superconducting wires may bear higher current density and have current transmission capability of 2 or 3 orders higher than that of copper conductors. This is because magnet developed based on superconducting wires can be constructed even more compact. Superconducting wires with different specifications can be combined to realize a high homogeneous and high magnetic field coil. In order to obtain a magnetic field above 9T, a combination of NbTi coils and $Nb_3Sn$ coils operating at liquid-helium temperature is commonly used; however, use of $Nb_3Sn$ superconducting wires increases the technical difficulty of the magnet system and has a higher cost.

SUMMARY OF THE INVENTION

In order to overcome the drawbacks of the prior art, a superconducting magnet system composed of superconducting coils based on NbTi/Cu superconducting wires is proposed by present invention, which operates at liquid-helium temperature and can generate a magnetic field strength higher than 9.4 T. The magnetic field has inhomogeneity less than 0.15 ppm in a spherical range with a diameter of 50 mm. The magnet, after quenching, can effectively suppress the damages on surrounding equipments caused by magnetic-flux expansion. A stable superconducting coil ensures the operation stability of the superconducting magnet while reduces the whole cost of the system.

The superconducting magnet system of present invention is composed of a main coil, a peripheral coil, a quench protection circuit, a quench heater and a power supply. The main coil is formed by assembling sequentially a plurality of concentric solenoid coils from inner layer to outer layer in the radial direction, and wire of each of the solenoid coils is made from NbTi/Cu. The solenoid coils are sequentially, from inner layer to outer layer in the radial direction, an inner main coil, a stabilization coil, a first compensation coil of the stabilization coil, a second compensation coil of the stabilization coil, a first classification coil, a second classification coil, a third classification coil, a forth classification coil, a first outer reinforcement magnetic field coil, a second outer reinforcement magnetic field coil, a first end outer compensation coil, and a second end outer compensation coil. All of the coils are connected in series to form the main coil of the superconducting system. The peripheral coil is assembled outside the main coil and sequentially comprises, from inner to outside in the radial direction, a first back roll coil, a second back roll coil, a first superconducting coil for compensating sixth harmonic component, a second superconducting coil for compensating sixth harmonic component, a shielding ring and a shielding coil. The main coil and the peripheral coil of the superconducting magnet system construct together a high homogeneous and high magnetic field superconducting magnet coil system.

The quench protection circuit of the superconducting magnet system of present invention consists of a lot of loop circuits, each of which is formed by a corresponding protection resistor and a diode which are connected with coil in series. A corresponding quench heater is installed for each coil. When the quench protection circuit detects a quenching coil, it controls a switch to shut down the power supply quickly, and controls the corresponding quench heater to heat the coil so as to quench each coil rapidly. After quenching, each coil discharges in respective serial-connected loop circuit whereby protect the coil from being burnt out.

The present invention adopts superconducting coil composed of NbTi/Cu superconducting wires with high current density, under liquid-helium temperature condition where the operating temperature of the magnet is 4.2K, a magnetic field of 9.4 T can be obtained within a room temperature space having a diameter of 50 mm, and thus the cost of the superconducting magnet can be reduced.

The present invention uses conductors of different specifications to combine the superconducting coils in classification, the inner layer superconducting coils of the magnet system operate at a lower current density, for example 96.54 A/mm$^2$. The current density of the superconducting coils may be gradually increased from superconducting coil of the innermost layer to superconducting coil of the outmost layer, and the shielding coil on the outmost layer may operate at the highest current intensity, for example 188.3 A/mm$^2$. A stabilization coil with two compensation coils is assembled on the outer surface of the innermost inner main superconducting coil. The two compensation coils are connected in series with the stabilization coil, which are then connected in parallel with a resistor R to form a loop circuit.

The classification of superconducting coil current is achieved by selecting superconducting wires with different diameters, the wire diameters of the superconducting coils closely adjacent to each other increase gradually from inner layer to outer layer, with a diameter difference between adjacent superconducting coils less than 0.05 mm, that is, from the inner layer to the outer layer of superconducting coils, each superconducting coil has a wire diameter gradually increased by a value less than 0.05 mm.

The compensation coil of the superconducting magnet system of the present invention consists of the first compensation coil of the stabilization coil and the second compensation coil of the stabilization coil, the first end outer compensation coil and the second end outer compensation coil, the first superconducting coil for compensating sixth harmonic component and the second superconducting coil for compensating sixth harmonic component, each pair of which being symmetrically arranged to each other respectively to achieve the required coil homogeneity. In present invention, back roll superconducting coils that are wound in the reverse direction to that of the main coil are added to reduce the high-order harmonic components, so as to achieve magnetic field inhomogeneity less than 0.15 ppm.

The superconducting magnet system of the present invention uses the back roll coil as the shielding coil of the main magnet, the radius of the shielding coil being 2.75 times of the average radius of the inner main coil. The shielding coil may compress the 5G line of the outer magnetic field of the superconducting magnet system within a range with 0.85 m in its radial direction and 1.45 m in its axial direction. Herein, 5G line refers to the boundary line of the region having magnetic field strength lower than 5 Gauss, and the magnetic field strength on the boundary line is 5 Gauss.

In the case that the shielding coil quenches, the magnetic field of the main magnet will rapidly expand in extremely short time, which will cause the damages to the electronic devices near the magnet. In the present invention, metal materials, such as copper or aluminum are arranged near the shielding coil as a shielding ring for shielding induction. Due to the current decay caused by the quench of the shielding coil, the magnetic field leakage of the main magnet can be compensated by the magnetic field inducing a current in the shielding ring.

According to the invention, in order to overcome local coil quench, which will increase the current in other unquenched coils due to electromagnetic coupling whereby results in stress overload of those coils, quench heaters are arranged and used at the low magnetic field region of the coils. Once a coil quench is detected, all the coils in superconducting state are triggered immediately to quench simultaneously. The magnet adopts resistors and bidirectional diodes connected in series to form current loops to protect the superconducting magnet system.

The principle advantages of the present invention lie in:

1) With NbTi/Cu superconducting wires and the optimal classification of coil current, a higher magnetic field can be achieved. For example, a magnetic field of 9.43 T can be obtained, so that a 400 MHz nuclear magnetic resonance magnet system with high homogeneity and high magnetic field can be achieved using NbTi/Cu superconducting coils;

2) With a stabilization coil arranged outside the high magnetic field coil, the stabilization coil is connected to a resistor R, the maximum magnetic field of the high magnetic field winding can be reduced when the magnet is charged, while improving the charge/discharge rate of the coils;

3) With a quench-induced current shielding ring of a high conductivity arranged inner the shielding coil, the rapid magnetic field expansion of the magnet caused by the quenched shielding coil can be prevented from damaging the surrounding electronic devices;

4) With back roll superconducting coils arranged on the outside of the main magnet, the high-order harmonic components of magnetic field can be compensated and the homogeneity of the superconducting magnet in the working area can be improved;

5) With the reasonable configuration of the radiuses of the main coil and the shielding coil, a higher efficiency of magnetic field shielding can be achieved and 5G line of the superconducting magnet with high homogeneity can be made very small;

6) With a heater arranged at the low magnetic field region of each classified superconducting coil, all coils are automatically triggered to quench simultaneously when a quench signal is detected by a coil, which ensures that the coils will not be over-stressed and the maximum hot-point temperature of the coil can be suppressed.

DETAILED DESCRIPTION OF PREFERRED EMBODIMENTS

Hereinafter, the present invention will be further described with reference to drawings and specific embodiments.

Figure 1:
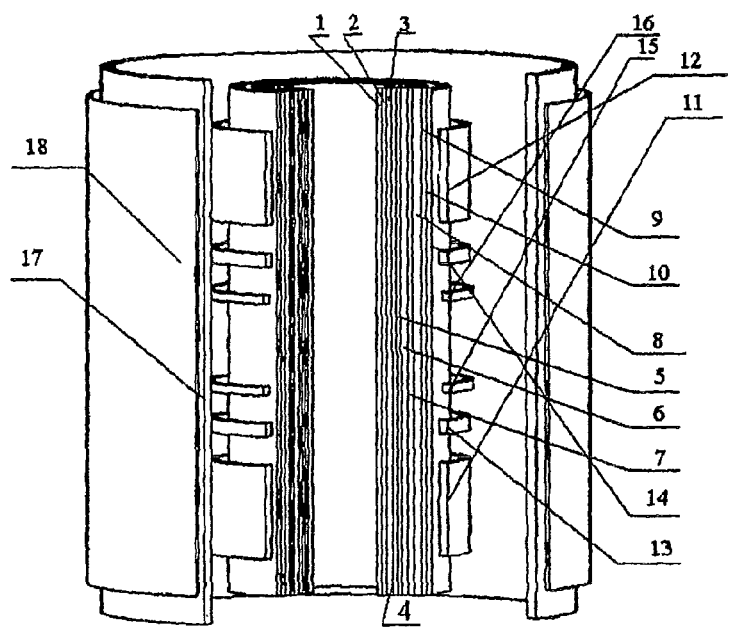
FIG. 1 is a schematic illustration of the superconducting magnet construction according to the present invention, comprising: an inner main coil 1, a stabilization coil 2, a first compensation coil 3 of the stabilization coil, a second compensation coil 4 of the stabilization coil, a first classification coil 5, a second classification coil 6, a third classification coil 7, a forth classification coil 8, a first outer reinforcement magnetic field coil 9, a second outer reinforcement magnetic field coil 10, a first end outer compensation coil 11, a second end outer compensation coil 12, a first back roll coil 13, a second back roll coil 14, a first superconducting coil for compensating sixth harmonic component 15, a second superconducting coil for compensating sixth harmonic component 16, a shielding ring 17, and a shielding coil 18.
Figure 2:
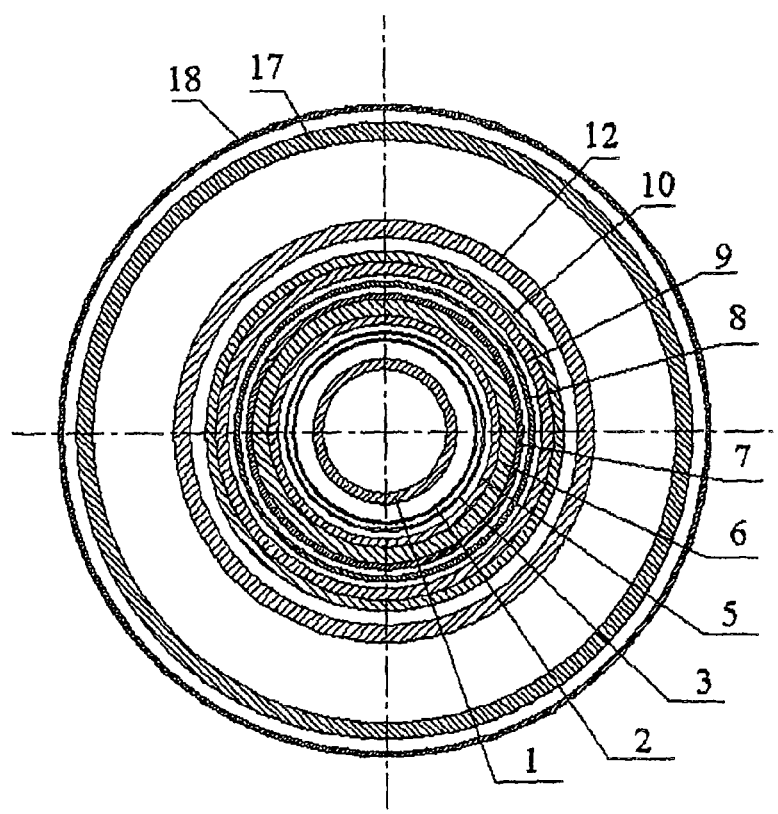
FIG. 2 is an enlarged top view of the upside of the superconducting magnet.

FIG. 1 is a schematic illustration of the superconducting magnet construction according to the present invention. The superconducting magnet system of the present invention is composed of a main coil, a peripheral coil, a quench protection circuit, a quench heater and a power supply. The main coil of the superconducting magnet system of the present invention is formed by assembling in turn a plurality of concentric solenoid coils from inner layer to outer layer in radial direction, material of each of the solenoid coils is NbTi/Cu. Those solenoid coils sequentially consist of, from inner layer to outer layer in the radial direction, an inner main coil 1, a stabilization coil 2, a first compensation coil 3 of the stabilization coil, a second compensation coil 4 of the stabilization coil, a first classification coil 5, a second classification coil 6, a third classification coil 7, a forth classification coil 8, a first outer reinforcement magnetic field coil 9, a second outer reinforcement magnetic field coil 10, a first end outer compensation coil 11, and a second end outer compensation coil 12, which are connected in series to form the main coil of the superconducting magnet system. The peripheral coil is assembled at the outside of the main coil and sequentially comprise, from inner layer to outer layer in the radial direction, a first back roll coil 13, a second back roll coil 14, a first superconducting coil for compensating the sixth harmonic component 15, a second superconducting coil for compensating the sixth harmonic component 16, a shielding ring 17, and a shielding coil 18. The compensation coils of the superconducting magnet system of the present invention comprise the first compensation coil 3 of the stabilization coil and the second compensation coil 4 of the stabilization coil, the first end outer compensation coil 11 and the second end outer compensation coil 12, the first superconducting coil for compensating the sixth harmonic component 15 and the second superconducting coil for compensating the sixth harmonic component 16, each pair of which being symmetrically arranged to each other respectively to achieve the required coil homogeneity. FIG. 2 is an enlarged top view of the upside of the superconducting magnet of the present invention.

As shown in FIG. 1, since the inner main coil 1 is in the region of the highest magnetic field, magnetic field strength during normal operation at liquid-helium temperature can achieve 9.43 T. The operation temperature margin of NbTi/Cu coil is 0.2K. A stabilization coil group formed by the stabilization coil 2, the first compensation coil 3 of the stabilization coil and the second compensation coil 4 of the stabilization coil is used to reduce the magnetic field of the coils during the excitation, so that the operation temperature margin of the inner main coil 1 can be raised to above 1K, whereby improving the stability of the inner main coil 1. When charging is completed, the current in the stabilization coil group slowly decays due to the stabilization coil resistor within the loop circuit, so that the innermost coil gradually reaches a normal operation magnetic field. The first classification coil 5, the second classification coil 6, the third classification coil 7, the forth classification coil 8, the first outer reinforcement magnetic field coil 9 and the second outer reinforcement magnetic field coil 10 take a current homogeneous classification technique to reduce the maximum stress of the coils and improve the average current density of the coils. Current classification is implemented by selecting superconducting wires with different diameters, and the wire diameter of each of the superconducting coils closely adjacent to each other from inner layer to outside layer may increase gradually from layer to layer, with a wire diameter difference between the adjacent superconducting coils less than 0.05 mm. The forth classification coil 8, the first outer reinforcement magnetic field coil 9, and the second outer reinforcement magnetic field coil 10 are separated from each other by a gap of 6 mm to 8 mm to reduce interface and radial electromagnetic stress. The first end outer compensation coil 11 and the second end outer compensation coil 12 are used to compensate for the magnetic field attenuation along the axial direction of the coils. The first superconducting coil for compensating for the sixth harmonic component 15 and the second superconducting coil for compensating for the sixth harmonic component 16 are used to compensate for the sixth-order component of the main magnetic field of the superconducting magnet. The first back roll coil 13 and the second back roll coil 14 are wound in the reverse direction to that of the main coil and are used to further compensate for high-order harmonic components of the magnetic field, so that the magnetic field homogeneity of 0.15 ppm is realized within a working space having a diameter of 50 mm. The shielding ring 17 of metal material such as copper and aluminum is arranged inside the shielding coil 18, when the shielding coil 18 quenches due to disturbance, the sudden expansion of main magnetic field flux of the magnet can be eliminated by the induced magnetic field generated by the induction current, so that the magnet system has a good electromagnetic compatibility and damages to surrounding electronic devices can be avoided. The shielding coil 18 is assembled in the radial direction at a position 2.75 times of the average radius of the main magnet, and has a magnetic moment with the same magnitude but the opposite direction as that of the main coil, so that a shielding area for magnetic field of the main magnet is less than 0.85 m in the radial direction and less than 1.45 m in the axial direction.

Figure 3:
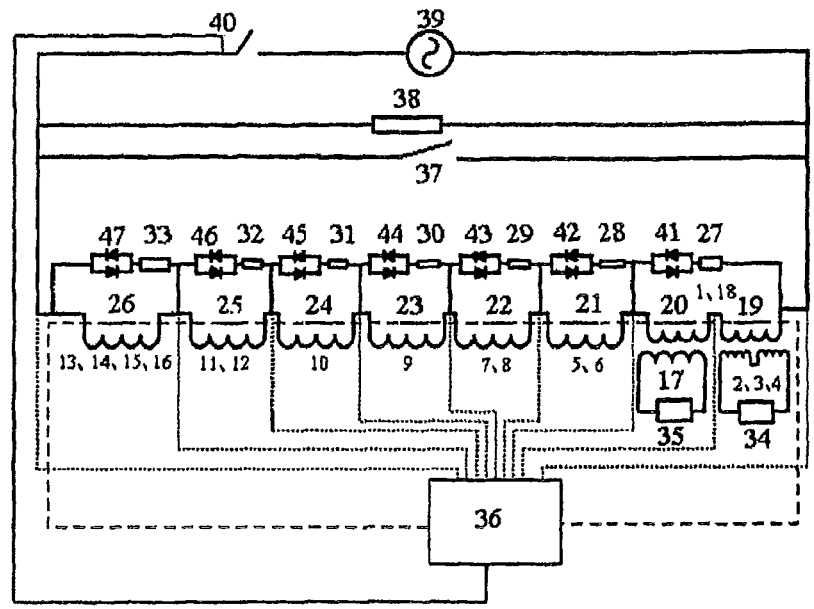
FIG. 3 is a schematic illustration of the quench protection circuit of the superconducting magnet system, including: a quench heater 19, a quench heater 20, a first quench heater 21, a second quench heater 22, a third quench heater 23, a forth quench heater 24, a fifth quench heater 25, a sixth quench heater 26, a first quench protection resistor 27, a second quench protection resistor 28, a third quench protection resistor 29, a forth quench protection resistor 30, a fifth quench protection resistor 31, a sixth quench protection resistor 32, a seventh quench protection resistor 33, a stabilization coil resistor 34, a shielding resistor 35, a quench detection and control unit 36, a superconducting switch 37, a protection resistor connected in series as a whole 38, a power supply 39, a switch 40, a first diode 41, a second diode 42, a third diode 43, a forth diode 44, a fifth diode 45, a sixth diode 46, a seventh diode 47.

FIG. 3 is a schematic illustration of the quench protection circuit of the superconducting magnet system according to the present invention, wherein one power supply 39 is used to provide power for the whole superconducting magnet through a switch 40. The inner main coil 1, the shielding coil 18, the first quench protection resistor 27 and the first diode 41 are connected in series to form a loop circuit, while the quench heater 19 and the quench heater 20 are assembled on the outer surface of the inner main coil 1 and the outer surface of the shielding coil 18 respectively; the heaters 19 and 20 are drawn outside through conductors to connect with the quench detection and control unit 36; When a coil quenches, the inner main coil 1 and the shielding coil 18 can discharge through the loop circuit formed by the inner main coil 1, the shielding coil 18, the first quench protection resistor 27 and the first diode 41 connected in series. Similarly, the first classification coil 5, the second classification coil 6, the second quench protection resistor 28 and the second diode 42 are connected in series to form a loop circuit, and the first quench heater 21 is assembled on the outer surface of the first classification coil 5, and the heater 21 is drawn outside through a conductor to connect with the quench detection and control unit 36. The third classification coil 7, the forth classification coil 8, the third quench protection resistor 29 and the third diode 43 are connected in series to form a loop circuit, and the second quench heater 22 is assembled on the outer surface of the third classification coil 7, and the heater 22 is drawn outside through a conductor to connect with the quench detection and control unit 36. The first outer reinforcement magnetic field coil 9, the forth quench protection resistor 30 and the forth diode 44 are connected in series to form a loop circuit, and the third quench heater 23 is assembled on the outer surface of first outer reinforcement magnetic field coil 9, and the heater 23 is drawn outside through a conductor to connect with the quench detection and control unit 36. The second outer reinforcement magnetic field coil 10, the fifth quench protection resistor 31, and the fifth diode 45 are connected in series to form a loop circuit, and the forth quench heater 24 is assembled on the outer surface of the second outer reinforcement magnetic field coil 10, and the heater 24 is drawn outside through a conductor to connect with the quench detection and control unit 36. The first end outer compensation coil 11, the second end outer compensation coil 12, the sixth quench protection resistor 32, and the sixth diode 46 are connected in series to form a loop circuit, and a fifth quench heater 25 is assembled on the outer surface of the first end outer compensation coil 11, and the heater 25 is drawn outside through a conductor to connect with the quench detection and control unit 36. The first back roll coil 13, the second back roll coil 14, the first superconducting coil for compensating for the sixth harmonic component 15, the second superconducting coil for compensating for the sixth harmonic component 16, the seventh quench protection resistor 33, and the seventh diode 47 are connected in series to form a loop circuit, wherein a sixth quench heater 26 is assembled on the outer surface of the first back roll coil 13, and the heater 26 is drawn outside through a conductor to connect with the quench detection and control unit 36. During the operation of the superconducting magnet, the superconducting switch 37 is closed and the power supply switch 40 is open, the whole superconducting magnet forming a zero-loss closed loop circuit, which does not need any supply from the power supply. A protection resistor 38 connected in series to the whole is connected in series to the superconducting magnet, and is used to limit the terminal voltage across the two terminals of the superconducting magnet, to avoid producing an over-high voltage when the superconducting magnet quenches.

The quench detection and control unit 36 detects quench signal of coils. When detecting a quench, the quench detection and control unit 36 sends out a trigger signal to open the switch 40 to disengage the power supply 39 from the superconducting magnet, all of the heaters heat and further quench every coil, and the quenched coils discharge in their respective protection circuits, thus the energy of the magnet system is released evenly, whereby the maximum temperature increase can be suppressed. When the magnet charges, since the variance in the flux of the inner main coil 1, the stabilization coil 2, the first compensation coil of the stabilization coil 3, the second compensation coil of the stabilization coil 4 induce inverted current which produces a high magnetic field, and the high magnetic field superposes with the magnetic field of the inner main coil 1, which reduces the maximum magnetic field of the inner main coil 1. After the charge of the magnet is completed, the connection between the power supply and the magnet is maintained, and the stabilization coil 2, the first compensation coil of the stabilization coil 3, the second compensation coil of the stabilization coil 4 are connected in parallel with a stabilization coil resistor 34, the stabilization coil current will decay to zero finally, establishing the operation current and operation magnetic field required by the magnet system. The shielding ring 17 and a shielding resistor 35 are connected to form a loop circuit, which is used to shield the magnetic field of the magnet system in a certain range.

Figure 4:
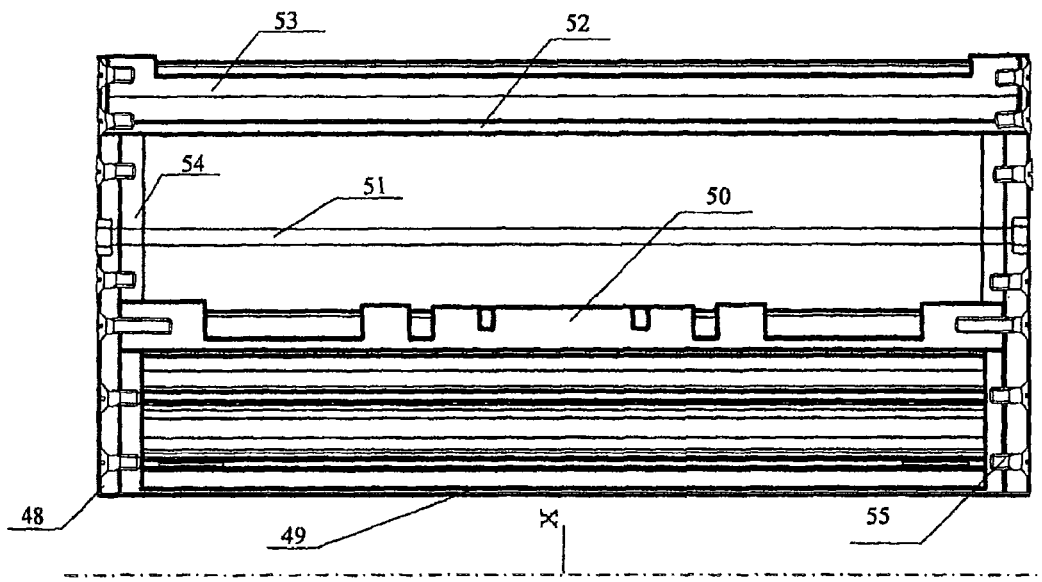
FIG. 4 is a whole structure illustration of the superconducting magnet, including: a mounting end-plate of coils 48, a main coil framework 49, a compensation coil framework 50, a supporting screw 51, a framework of eddy current shielding ring 52, a framework of shielding coil 53, a locating end-plate 54, a locating and fixing screw 55.

FIG. 4 is a whole structure illustration of the superconducting magnet. The inner main coil 1, the stabilization coil 2, the first compensation coil of the stabilization coil 3, the second compensation coil of the stabilization coil 4, the first classification coil 5, the second classification coil 6, the third classification coil 7, the forth classification coil 8, the first outer reinforcement magnetic field coil 9 and the second outer reinforcement magnetic field coil 10 are directly mounted on a framework 49. The first end outer compensation coil 11, the second end outer compensation coil 12, the first back roll coil 13, the second back roll coil 14, the first superconducting coil for compensating for the sixth harmonic component 15, and the second superconducting coil for compensating for the sixth harmonic component 16 are mounted on a framework 50. The shielding ring 17 is assembled on a support structure 52, the framework of the shielding coil 18 is arranged outside of the support structure 52. The whole superconducting magnet is fixed to the framework 49 through the end plate 48 and the screw 55. In order to support the shielding coil 18, the locating plate 54 is fixed on the end plate 48. The whole superconducting magnet uses screw 51 to connect the end plates 48 on both sides by screws.

Figure 5:
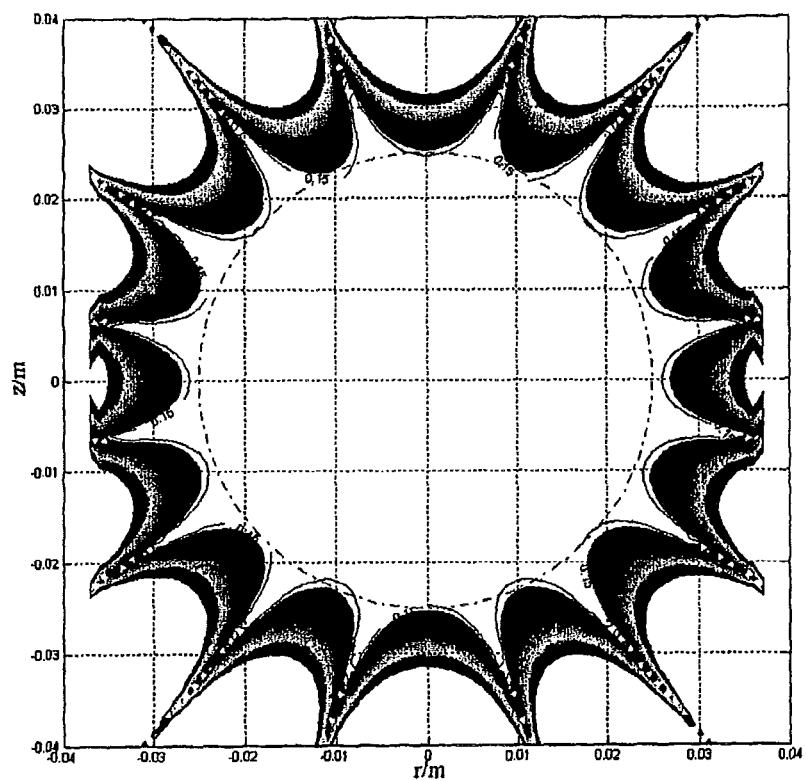
FIG. 5 is an equipotential line diagram of the magnetic field distribution within the working space of the magnet embodiment shown in FIG. 1.

FIG. 5 is an equipotential diagram of the magnetic field distribution within the working space of the magnet embodiment shown in FIG. 1, wherein an operation current of 67.189 A is used, the diameter of the room temperature aperture of the superconducting magnet is 50 mm, and the magnetic field inhomogeneity in that region is less than 0.15 ppm.

Figure 6:
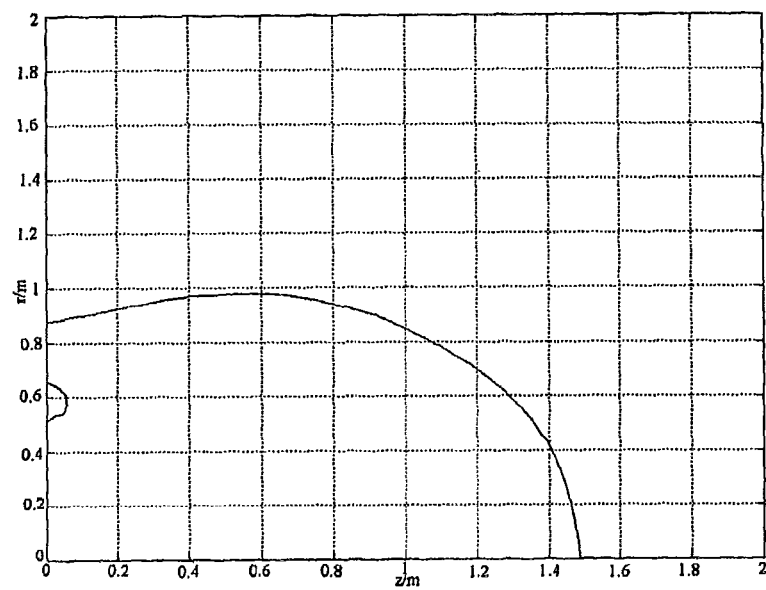
FIG. 6 is a 5G line diagram of the superconducting magnet system.

FIG. 6 is a 5G line diagram of the superconducting magnet system. As shown in FIG. 6, the obtained 5G line of the coils is 0.85 m in R direction and is less than 1.45 m in Z direction, which demonstrates that the superconducting magnet structure has a strong electromagnetic compatibility.

According to the present invention, a superconducting magnet with magnetic field strength up to 9.43 T can be developed using NbTi/Cu superconducting coils, which is suitable for special scientific instruments, particularly the 400 MHz nuclear magnetic resonance system, with advantages of low cost, perfect electromagnetic compatibility, convenient for use, and reliable operation, etc.

What is claimed is:

1. A superconducting magnet system for generating high homogeneity and high magnetic field, the superconducting magnet system comprising a main coil, a peripheral coil, a quench protection circuit, a quench heater and a power supply, wherein the main coil is formed by assembling sequentially a plurality of concentric solenoid coils from inner layer to outside layer in the radial direction in the order of an inner main coil, a stabilization coil, a first compensation coil of the stabilization coil, a second compensation coil of the stabilization coil, a first classification coil, a second classification coil, a third classification coil, a fourth classification coil, a first outer reinforcement magnetic field coil, a second outer reinforcement magnetic field coil, a first end outer compensation coil, and a second end outer compensation coil; wherein the peripheral coil is located outside the main coil and sequentially comprises, from inner layer to outer layer in the radial direction, a first back roll coil, a second back roll coil, a first superconducting coil for compensating for the sixth harmonic component, a second superconducting coil for compensating for the sixth harmonic component, a shielding ring, and a shielding coil; wherein the quench protection circuit comprises a plurality of loop circuits, each of which is formed by a corresponding protection resistor, a diode and each coil connected in series, and wherein one quench heater is correspondingly assembled for each coil.

2. The superconducting magnet system for generating high homogeneity and high magnetic field according to claim 1, wherein the wire diameters of the superconducting coils closely adjacent to each other increase gradually layer by layer from inner layer to outer layer, with a wire diameter difference less than 0.05 mm; and the fourth classification coil, the first outer reinforcement magnetic field coil and the second outer reinforcement magnetic field coil are separated by a gap of 6-8 mm.

3. The superconducting magnet system for generating high homogeneity and high magnetic field according to claim 1, wherein the shielding coil is assembled at a position that is 2.75 times of the average radius of the main magnet in the radial direction; the magnetic moment of the shielding coil is in an opposite direction to that of the magnetic moment of the main coil; the radius of the shielding coil is 2.75 times of the average radius of the inner main coil; and the shielding ring is mounted inside the shielding coil.

4. The superconducting magnet system for generating high homogeneity and high magnetic field according to claim 1, wherein the first back roll coil, and the second back roll coil are rolled in a direction opposite to a rolling direction of the main coil.

5. The superconducting magnet system for generating high homogeneity and high magnetic field according to claim 1,
   wherein the inner main coil, the shielding coil, a first quench protection resistor and a first diode are connected in series to form a loop circuit, wherein a quench heater is mounted on the outer surface of the inner main coil, and a quench heater is mounted on the outer surface of the shielding coil;
   wherein the first classification coil, the second classification coil, a second quench protection resistor and a second diode are connected in series to form a loop circuit, wherein a first quench heater is mounted on the outer surface of the first classification coil;
   wherein the third classification coil, the fourth classification coil, a third quench protection resistor and a third diode are connected in series to form a loop circuit, wherein a second quench heater is mounted on the outer surface of the third classification coil;
   wherein the first outer reinforcement magnetic field coil, a fourth quench protection resistor and a fourth diode are connected in series to form a loop circuit, wherein a third quench heater is mounted on the outer surface of the first outer reinforcement magnetic field coil;
   wherein the second outer reinforcement magnetic field coil, a fifth quench protection resistor, and a fifth diode are connected in series to form a loop circuit, wherein a fourth quench heater is mounted on the outer surface of the second outer reinforcement magnetic field coil;
   wherein the first end outer compensation coil, the second end outer compensation coil, a sixth quench protection resistor, and a sixth diode are connected in series to form a loop circuit, wherein a fifth quench heater is mounted on the outer surface of the first end outer compensation coil;
   wherein the first back roll coil, the second back roll coil, the first superconducting coil for compensating for the sixth harmonic component, the second superconducting coil for compensating for the sixth harmonic component, a seventh quench protection resistor, and a seventh diode are connected in series to form a loop circuit, wherein a sixth quench heater is mounted on the outer surface of the first back roll coil;
   wherein the quench heater mounted on the outer surface of the inner main coil, the quench heater mounted on the outer surface of the shielding coil and each of the first to the sixth quench heaters are drawn outside through conductors to connect with a quench detection and control unit;
   and wherein the stabilization coil, the first compensation coil of the stabilization coil, and the second compensation coil of the stabilization coil are connected in series and then connected in parallel with a stabilization coil resistor to form a loop circuit.

6. The superconducting magnet system for generating high homogeneity and high magnetic field according to claim 1, wherein the shielding ring and a shielding resistor are connected to form a loop circuit, for shielding the magnetic field of the magnet system when the shielding coil quenches.

7. The superconducting magnet system for generating high homogeneity and high magnetic field according to claim 1, wherein wire material of each solenoid coil of the magnet system is NbTi/Cu.

8. The superconducting magnet system for generating high homogeneity and high magnetic field according to claim 1, wherein the first compensation coil of the stabilization coil and the second compensation coil of the stabilization coil, the first end outer compensation coil and the second end outer compensation coil, the first superconducting coil for compensating for the sixth harmonic component and the second superconducting coil for compensating for the sixth harmonic component are symmetric arranged to each other respectively.

* * * * *